United States Patent
Youssef et al.

(10) Patent No.: US 10,200,002 B1
(45) Date of Patent: Feb. 5, 2019

(54) RF PEAK DETECTION METHOD USING A SEQUENTIAL BASEBAND SCHEME

(71) Applicant: Marvell International Ltd., Hamilton (BM)

(72) Inventors: Shadi Youssef, San Jose, CA (US); Renaldi Winoto, Danville, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 137 days.

(21) Appl. No.: 15/338,258

(22) Filed: Oct. 28, 2016

Related U.S. Application Data

(60) Provisional application No. 62/247,867, filed on Oct. 29, 2015.

(51) Int. Cl.
*H03G 3/30* (2006.01)
*H04B 1/10* (2006.01)

(52) U.S. Cl.
CPC .......... *H03G 3/3068* (2013.01); *H04B 1/109* (2013.01); *H04B 1/1027* (2013.01); *H04B 1/1036* (2013.01); *H03G 3/3036* (2013.01)

(58) Field of Classification Search
CPC .... H04B 1/109; H04B 1/1027; H04B 1/1036; H03G 3/3036; H03G 3/3068
See application file for complete search history.

(56) References Cited

U.S. PATENT DOCUMENTS

| | | | | |
|---|---|---|---|---|
| 6,532,358 B1 * | 3/2003 | Earls | ............... | H03G 3/3068 375/345 |
| 6,724,251 B1 * | 4/2004 | Ziazadeh | ............ | H03F 1/0266 330/282 |
| 7,639,998 B1 * | 12/2009 | Halvorson | ............ | H03F 1/0272 455/234.2 |
| 8,737,545 B2 * | 5/2014 | Chari | ............ | H03G 3/3068 375/345 |
| 9,819,322 B2 * | 11/2017 | Kim | ............ | H03G 3/3036 |
| 2004/0105511 A1 * | 6/2004 | Wieck | ............ | H03F 1/0272 375/317 |
| 2005/0130615 A1 * | 6/2005 | Darabi | ............ | H03G 3/3052 455/232.1 |
| 2007/0076827 A1 * | 4/2007 | Beamish | ............ | H04L 27/3809 375/345 |
| 2013/0102267 A1 * | 4/2013 | Haub | ............ | H04B 1/10 455/296 |

(Continued)

Primary Examiner — Duc M Nguyen

(57) ABSTRACT

Systems, devices, and techniques for performing peak detection are described. A described receiver includes a first amplifier to amplify an input signal to generate a first amplified signal; a mixer to downconvert the first amplified signal to generate a downconverted signal; a second amplifier to amplify the downconverted signal to generate a second amplified signal; a filter, being selectably engageable by the receiver, a peak detector configured to perform voltage measurements of the second amplified signal; and switch circuitry. The switch circuitry is configured to selectably disengage the filter during a first measurement phase during which a first voltage measurement performed by the peak detector is indicative of an output voltage swing of the first amplifier, and to selectably engage the filter during a second measurement phase during which a second voltage measurement performed by the peak detector is indicative of an output voltage swing of the second amplifier.

21 Claims, 6 Drawing Sheets

(56) References Cited

U.S. PATENT DOCUMENTS

| | | | | |
|---|---|---|---|---|
| 2013/0156140 A1* | 6/2013 | Chari | ............... | H03G 3/3068 375/345 |
| 2015/0311950 A1* | 10/2015 | Cheung | ............ | H04L 25/03885 375/232 |
| 2017/0105184 A1* | 4/2017 | Kim | ............... | H03G 3/3036 |
| 2017/0254770 A1* | 9/2017 | Sestok, IV | ............ | G01N 27/228 |

* cited by examiner

RF PEAK DETECTION METHOD USING A SEQUENTIAL BASEBAND SCHEME

CROSS REFERENCE TO RELATED APPLICATIONS

This disclosure claims the benefit of the priority of U.S. Provisional Application Ser. No. 62/247,867, filed Oct. 29, 2015, and entitled "RF PEAK DETECTION METHOD USING A SEQUENTIAL BASEBAND SCHEME," which is incorporated herein by reference in its entirety.

BACKGROUND

Receivers use components such as an amplifier, mixer, and filter to process signals such as radio frequency (RF) signals. For example, a low-noise amplifier (LNA) amplifies a received signal, typically received at a carrier frequency. A mixer performs a downconversion of the received signal from a frequency such as a carrier frequency, to a lower frequency such as a baseband frequency. A receiver uses a filter to remove undesired signal components from the downconverted version of the received signal. Further, a baseband amplifier (BBA) amplifies a downconverted version of the amplified received signal. In some implementations, a receiver uses a peak detector to adjust a gain of the LNA via an automatic gain control (AGC) procedure, and another peak detector to adjust a gain of the BBA via another AGC procedure.

SUMMARY

The present disclosure includes systems and techniques for performing peak detection. According to an aspect of the described systems and techniques, a method for performing peak detection includes amplifying, via a first amplifier, an input signal to generate a first amplified signal; performing, by a mixer, a downconversion of the first amplified signal to generate a downconverted signal; amplifying, via a second amplifier, the downconverted signal to generate a second amplified signal; disengaging a filter during a first measurement phase, the filter being disposed between the mixer and a peak detector, the peak detector being coupled with output terminals of the second amplifier; engaging the filter during a second measurement phase; obtaining, by the peak detector, a first voltage measurement that is indicative of an output voltage swing of the first amplifier during the first measurement phase, and obtaining, by the peak detector, a second voltage measurement that is indicative of an output voltage swing of the second amplifier during the second measurement phase.

This and other implementations can include one or more of the following features. In some implementations, an automatic gain control process includes adjusting a gain of the first amplifier based on the first voltage measurement; and adjusting a gain of the second amplifier based on the second voltage measurement. In some implementations, the input signal includes a preamble portion and a data portion. In some implementations, the first measurement phase occurs during a reception of a first portion of the preamble portion, and the second measurement phase occurs during a reception of a second portion of the preamble portion. In some implementations, the first and second amplifiers are adjusted before a reception of the data portion. In some implementations, the filter includes a transistor. In some implementations, disengaging the filter includes causing the filter's transistor to be in an off-state. In some implementations, engaging the filter includes causing the filter's transistor to be in an on-state. In some implementations, the filter is coupled between an input terminal of the second amplifier and at least one of the output terminals of the second amplifier. In some implementations, the peak detector is configured to use first thresholds during the first measurement phase and use second thresholds during the second measurement phase, the first thresholds being established for gain control of the first amplifier, and the second thresholds being established for gain control of the second amplifier. In some implementations, the input signal includes a radio frequency signal, and performing the downconversion includes a conversion from a carrier frequency of the radio frequency signal to a baseband frequency.

The described systems and techniques can be implemented in electronic circuitry, computer hardware, firmware, software, or in combinations of them, such as the structural means disclosed in this specification and structural equivalents thereof. Similarly, method implementations can be realized from a disclosed system, computer-readable medium, or apparatus, and system implementations can be realized from a disclosed method, computer-readable medium, or apparatus.

For example, one or more disclosed embodiments can be implemented in various systems and apparatus, including, but not limited to, a special purpose data processing apparatus (e.g., a wireless communication device such as a wireless access point, a remote environment monitor, a router, a switch, a computer system component, a medium access unit), a mobile data processing apparatus (e.g., a wireless client, a cellular telephone, a smart phone, a personal digital assistant (PDA), a mobile computer, a digital camera), a general purpose data processing apparatus such as a computer, or combinations of these.

In another aspect, a device, such as a receiver, for peak detection includes a first amplifier configured to amplify an input signal to generate a first amplified signal; a mixer, coupled with the first amplifier, the mixer configured to downconvert the first amplified signal to generate a downconverted signal; a second amplifier, coupled with the mixer, the second amplifier configured to amplify the downconverted signal to generate a second amplified signal; a filter disposed between the mixer and a peak detector, the filter being selectably engageable by the receiver, the filter configured to remove one or more undesired signal components from the downconverted signal, and the peak detector configured to perform voltage measurements of the second amplified signal; and switch circuitry. In some implementations, the switch circuitry is configured to selectably disengage the filter during a first measurement phase during which a first voltage measurement performed by the peak detector is indicative of an output voltage swing of the first amplifier, and to selectably engage the filter during a second measurement phase during which a second voltage measurement performed by the peak detector is indicative of an output voltage swing of the second amplifier. In some implementations, the device includes a gain controller, coupled with the first amplifier and the second amplifier, the gain controller configured to receive outputs corresponding to the first and second voltage measurements, and to adjust a gain of the first amplifier based on the first voltage measurement and to adjust a gain of the second amplifier based on the second voltage measurement.

These and other implementations can include one or more of the following features. In some implementations, the filter includes a transistor, and the switch circuitry is configured to disengage the filter by causing the transistor to be in an off-state, and wherein the switch circuitry is configured to engage the filter by causing the transistor to be in an on-state. In some implementations, the filter is coupled between an input terminal of the second amplifier and an output terminal of the second amplifier. In some implementations, the peak detector is configured to use first thresholds during the first measurement phase and use second thresholds during the second measurement phase, the first thresholds being established for gain control of the first amplifier, and the second thresholds being established for gain control of the second amplifier. In some implementations, the input signal includes a preamble portion and a data portion. In some implementations, the first measurement phase occurs during a reception of a first portion of the preamble portion, and the second measurement phase occurs during a reception of a second portion of the preamble portion. In some implementations, the first and second amplifiers are adjusted before a reception of the data portion. In some implementations, the mixer converts the first amplified signal from a carrier frequency to a baseband frequency. In some implementations, the mixer includes an active Gilbert-cell mixer or a passive mixer.

In yet another aspect, a system for peak detection includes a first amplifier configured to amplify an input signal to generate a first amplified signal; a mixer, coupled with the first amplifier, the mixer configured to downconvert the first amplified signal to generate a downconverted signal; a second amplifier, coupled with the mixer, the second amplifier configured to amplify the downconverted signal to generate a second amplified signal; a filter configured to remove one or more undesired signal components from the downconverted signal; a peak detector coupled with the second amplifier, the filter being coupled between the mixer and the peak detector; and a controller. In some implementations, the peak detector performs a first voltage measurement of the second amplified signal during a first measurement phase to detect a voltage swing of the first amplifier and performs a second voltage measurement of the second amplified signal during a second measurement phase to detect a voltage swing of the second amplifier. In some implementations, the controller is configured to disengage the filter during the first measurement phase such that an output voltage swing of the first amplifier is preserved for the first voltage measurement by the peak detector, engage the filter during the second measurement phase, adjust a gain of the first amplifier based on the first voltage measurement, and adjust a gain of the second amplifier based on the second voltage measurement.

Particular configurations of the technology described in this disclosure can be implemented so as to realize one or more of the following potential advantages. By combining separate peak detectors, a described technology reduces receiver complexity, and further reduces power, noise penalty, chip layout, or a combination thereof. In some implementations, a combined RF/BB peak detector operated at a baseband frequency reduces parasitic loading on one or more of a receiver's components that operate at a non-baseband frequency, such as a LNA. In some implementations, a low-pass pole at a mixer output does not have to be removed, thereby resulting in an improved mixer linearity. Wireless and wireline transceivers, and receivers, can use one or more of the described technologies. Further, the described technologies are not limited to the RF domain. The described technology can be suitable for any device that requires automatic gain control functionality, regardless of the frequency of operation.

Details of one or more implementations are set forth in the accompanying drawings and the description below. Other features and advantages may be apparent from the description and drawings, and from the claims.

DRAWING DESCRIPTIONS

Like reference symbols in the various drawings indicate like elements.

DETAILED DESCRIPTION

Figure 1:
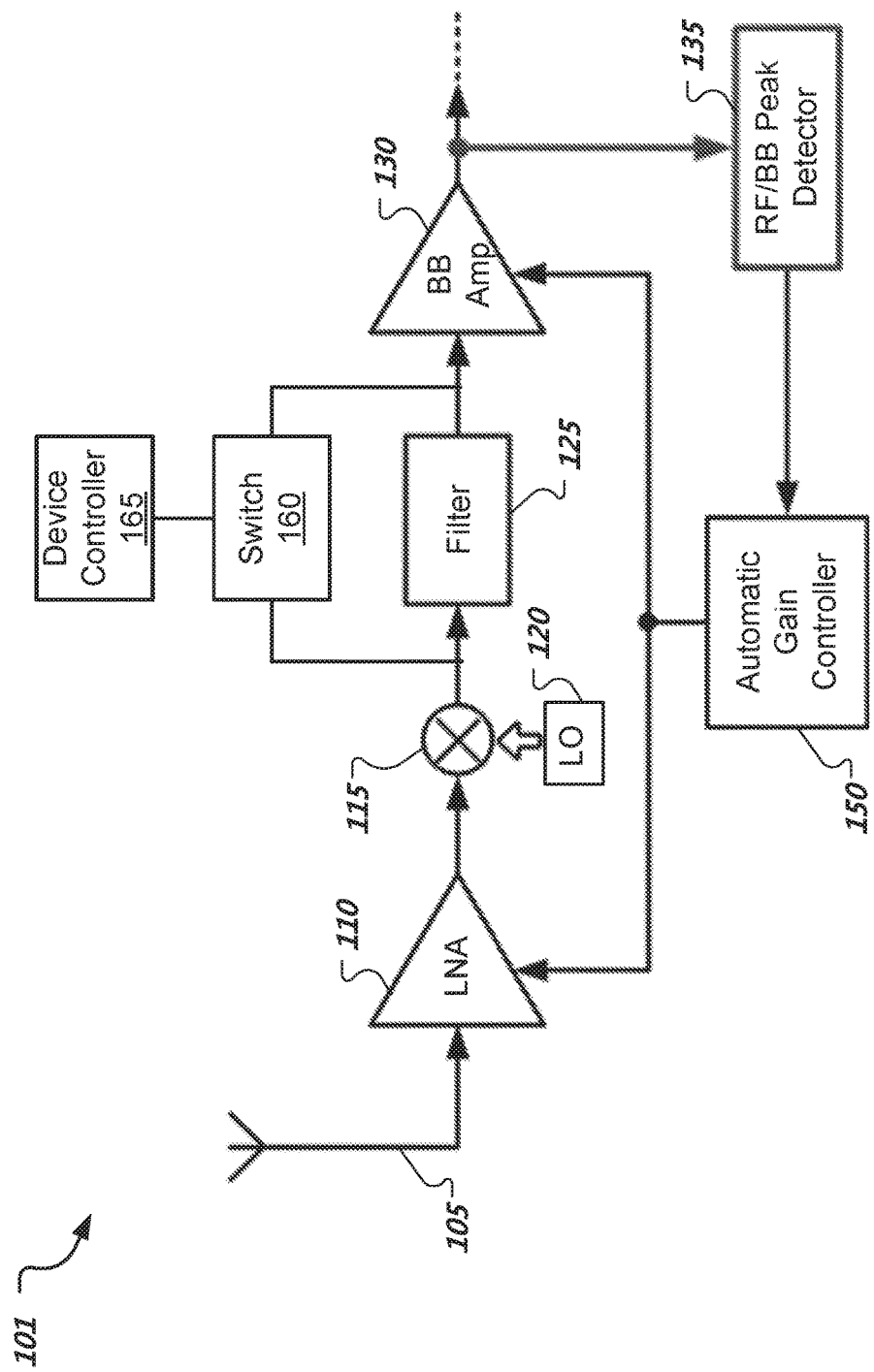
FIG. 1 shows a block diagram of a receiver portion of a wireless device that performs peak detection at baseband for RF and BB amplifier gain control.

FIG. 1 shows a block diagram of a receiver portion of a wireless device 101 that performs peak detection at baseband for RF and BB amplifier gain control. The wireless device 101 includes an antenna 105, low-noise amplifier (LNA) 110, mixer 115, local oscillator 120, filter 125, baseband amplifier (BBA) 130, RF/BB peak detector 135, automatic gain controller 150, and switch 160, and device controller 165. Typically, the LNA 110 is configured to amplify a signal without significantly adding noise, hence the name "low-noise." The mixer 115 uses a signal from the local oscillator (LO) 120 to downconvert an amplified signal from the LNA 110. Examples of mixer 115 include those illustrated in FIGS. 3A and 3B, other types are possible. The filter 125 performs filtering of the downconverted signal to remove undesired signal components. In some implementations, the filter 125 is a low-pass filter (LPF). Note that, in this example, the LNA 110 operates at a carrier frequency associated with the received RF input signal, whereas the BBA 130 operates at a lower, baseband frequency.

The automatic gain controller 150 controls a gain of the LNA 110 and a gain of the BBA 130 based on data collected by the RF/BB peak detector 135 during respective RF and BB measurement phases. The peak detector 135 is configured to detect a signal level, e.g., voltage swings, via an amplifier output signal. If the detected signal level is too high, the AGC 150 reduces the gain of an amplifier 110, 130 to avoid distortion. Otherwise, the automatic gain controller 150 keeps gain high in order to obtain the high receiver sensitivity.

The wireless device 101 performs RF and BB peak detection using the same peak detector 135 placed after the BBA 130, in this example, and accordingly, operates at a downconverted frequency, e.g., baseband. In some implementations, the device 101 performs RF/BB peak detection via the peak detector 135 sequentially, e.g., RF peak detection followed by BB peak detection. During a RF measurement phase, the device controller 165 operates the switch 160 to disengage, e.g., bypass, the filter 125 such that an unfiltered signal flows through the BBA 130. This unfiltered signal allows the peak detector 135 to detect an output voltage swing associated with the LNA 110 at the output terminals of the BBA 130 rather than at the output terminals of the LNA 110. The device controller 165, during a BB measurement phase, operates the switch 160 to engage, e.g., switch-in, the filter 125 and detect an output voltage swing from the BBA 130. In some implementations, the filter 125 includes the switch 160 to make the filter 125 be selectably engageable. In some implementations, the switch 160 either short-outs or does not short-out the filter 125 to respectively disengage or engage the filter 125.

During the RF measurement phase, the frequency response between output terminals of the LNA 110 and output terminals of the BBA 130 are essentially identical. Thus, the BB signal measured at the output terminals of the BBA 130 is an accurate reading of the RF LNA voltage swing at the output terminals of the LNA 110, e.g., LNA/RF peak detection is accurately performed by monitoring a signal at the output terminals of the BBA 130. Note that without disengaging the filter 125, a peak detector 135 located after the mixer 115 would likely fail to detect large voltage swings from the LNA 110 due to out-of-band interferers being removed.

In some implementations, the peak detector 135 compares an input signal voltage to threshold voltages to determine whether the input signal voltage reaches a high or low peak. In some implementations, the peak detector 135 is configured to use max and min thresholds, during the RF measurement phase, that are established for gain control of the LNA 110. In some implementations, the peak detector 135 is configured to use max and min thresholds, during the BB measurement phase, that are established for gain control of the BBA 130. The combined peak detection scheme can be implemented by any suitable mixer structure.

In some implementations, the frequency response of the mixer 115 does not have to be a single-pole low pass response; higher-orders are possible. For example, the device 101 can engage or disengage multiple frequency dependent elements, such as capacitors, that are between the LNA 110 and peak detector 135 (e.g., switched in or out) as needed to perform peak detection.

Figure 2:
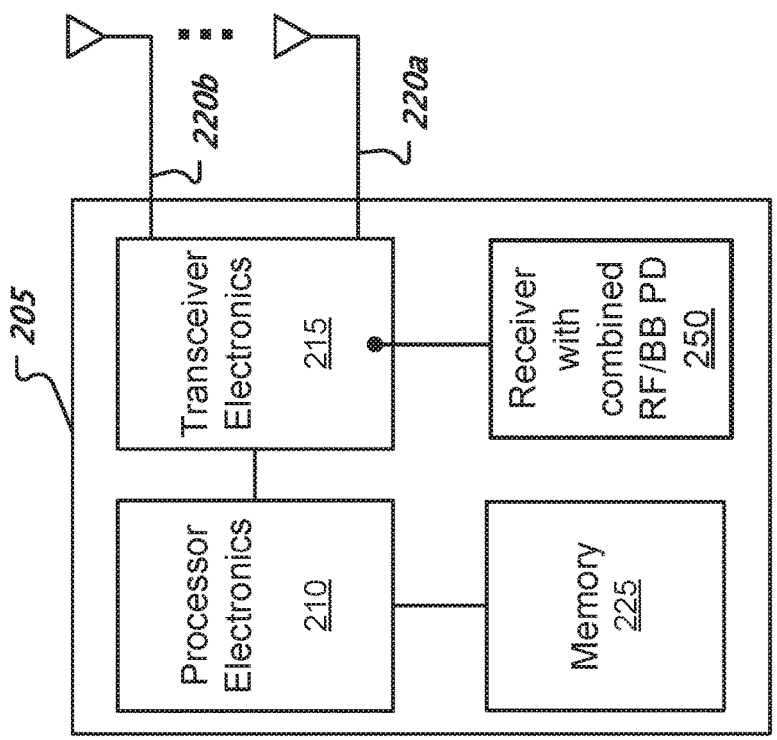
FIG. 2 shows a block diagram of another example of a wireless device.

FIG. 2 shows a block diagram of another example of a wireless device 205. The device 205 includes processor electronics 210, such as one or more processors that implement methods effecting the techniques presented in this disclosure. Various examples of device 205 include access point (AP), base station (BS), access terminal (AT), client station, or mobile station (MS). The device 205 includes transceiver electronics 215 to send and/or receive wireless signals over one or more antennas 220a-b. In some implementations, transceiver electronics 215 includes multiple radio units. In some implementations, a radio unit includes a baseband unit (BBU) and a radio frequency unit (RFU) to transmit and receive signals. The device 205 includes one or more memories 225 configured to store information such as data and/or instructions. In some implementations, the device 205 includes dedicated circuitry for transmitting and dedicated circuitry for receiving. In this example, the transceiver electronics 215 includes a receiver 250 with a combined RF/BB peak detector (PD) such as the one depicted by FIG. 1. In some implementations, the processor electronics 210 or a controller within the receiver 250 controls one or more aspects of peak detection such as when to switch between RF and BB peak detection.

Figure 3A:
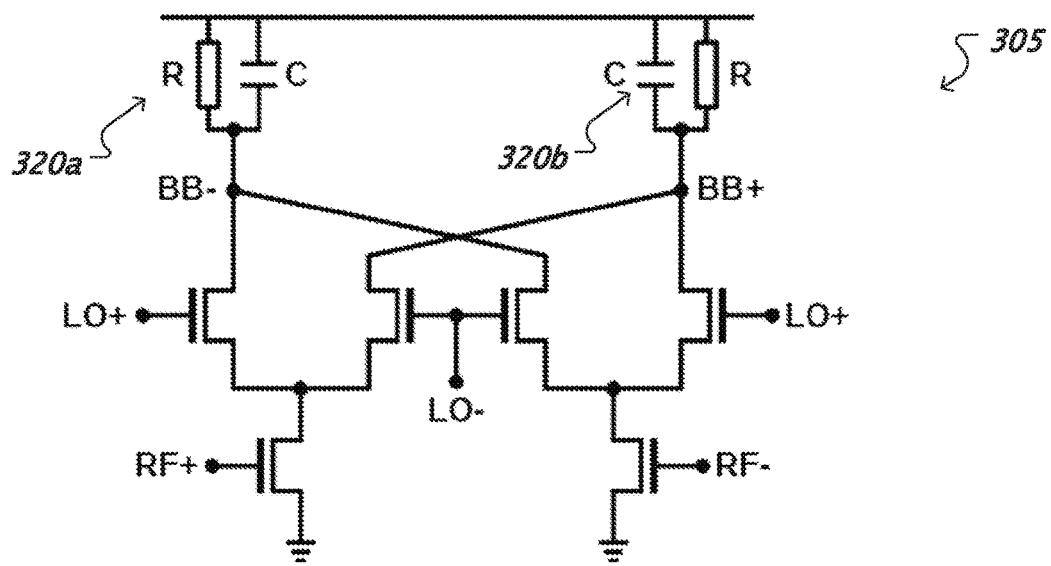
FIGS. 3A and 3B show schematics of different examples of mixers.
Figure 3B:
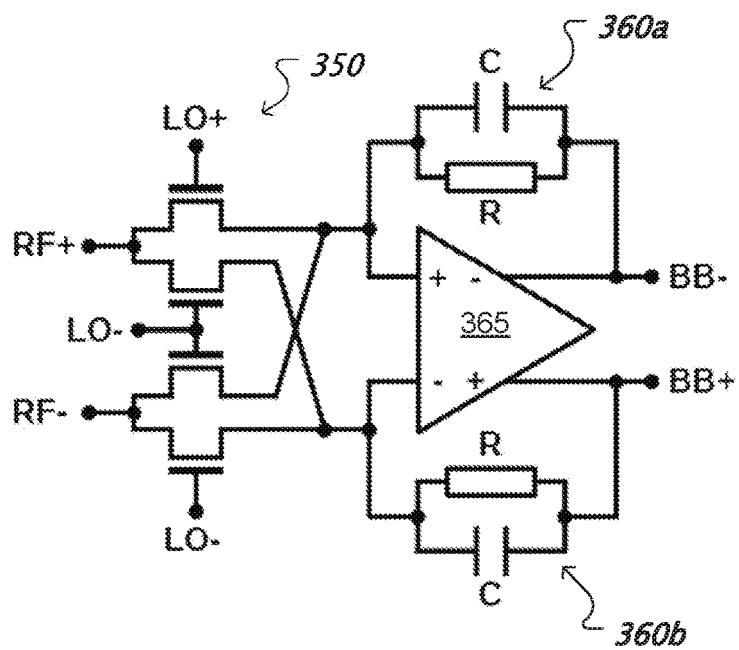

FIGS. 3A and 3B show schematics of different examples of mixers 305, 350 for use within a receiver. In some implementations, a device uses a mixer 305, 350 to downconvert a RF signal from a carrier frequency to a baseband frequency based on a LO signal. The RF signal includes positive (RF+) and negative (RF−) components. The LO signal includes positive (LO+) and negative (LO−) components. The mixers 305, 350 output a baseband signal that includes positive (BB+) and negative (BB−) components.

FIG. 3A shows a schematic of an example of an active Gilbert-cell mixer 305. The gates of two transistor pairs within the Gilbert-cell mixer 305 are driven by the LO+/− signals to perform mixing of the RF+/− signals to produce the downconverted output BB+/− signals. The active Gilbert-cell mixer 305 is "active" in the sense that the RF+/− signals are coupled within the mixer 305 via their own respective transistors that are separate from the two transistor pairs. In this example, the active Gilbert-cell mixer 305 includes low-pass RC (resistor-capacitor) pole filters 320a, 320b to remove undesired signal components. In some implementations, the filters 320a-b include a switch, e.g., transistor, that engages or disengages the capacitor of each filter 320a-b to carry out RF and BB peak detection as described herein.

FIG. 3B shows a schematic of an example implementation of a passive mixer 350. The passive mixer 350 includes two transistor pairs that are driven by the LO+/− signals to perform mixing of the RF+/− signals to produce the downconverted output BB+/− signals via amplifier 365. Low-pass RC pole filters 360a, 360b, coupled with the amplifier 365, are configured to remove undesired signal components. In some implementations, the filters 360a-b include a switch, e.g., transistor, that engages or disengages the capacitor of each filter 360a-b to carry out RF and BB peak detection as described herein.

Figure 4:
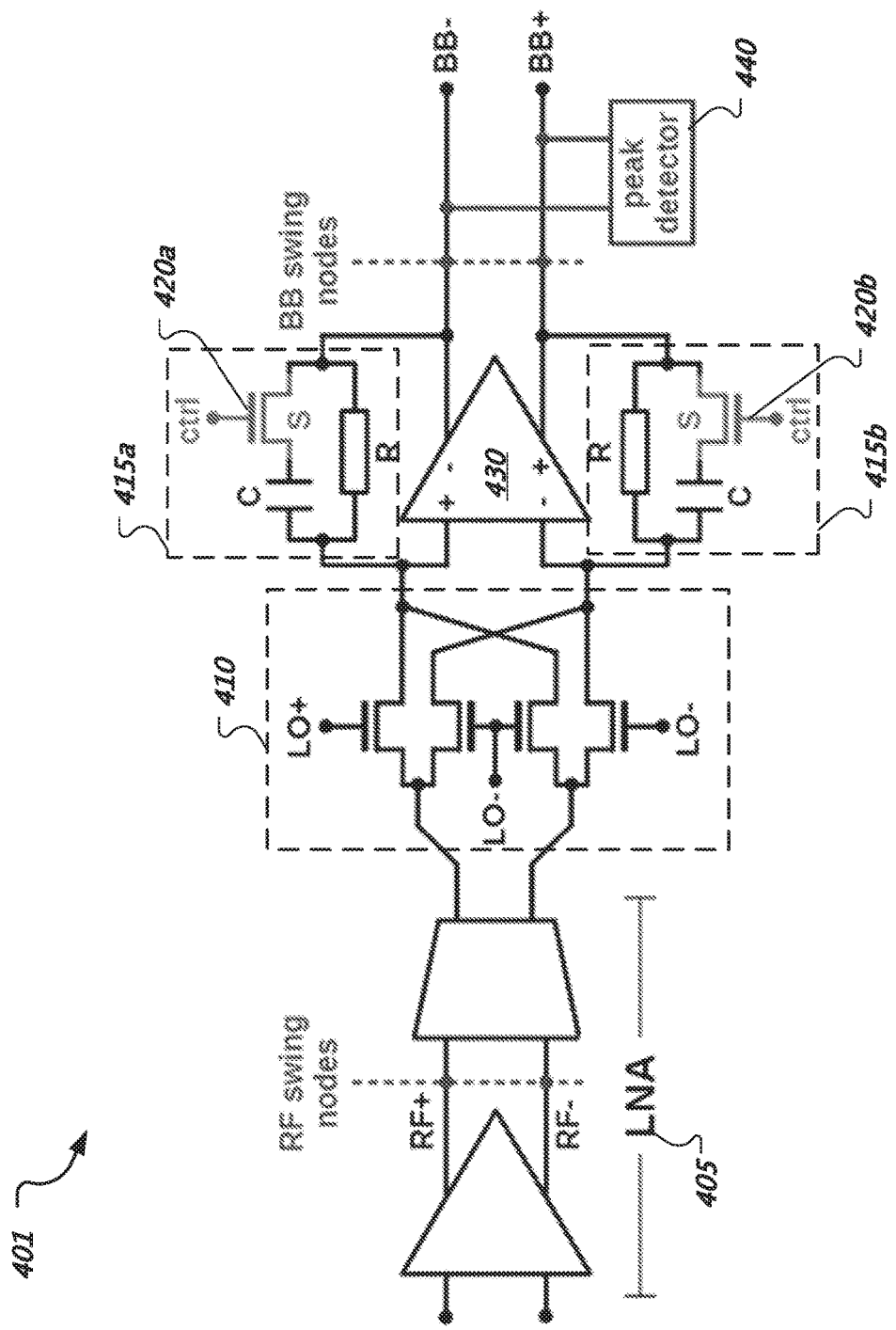
FIG. 4 shows a block diagram of a receiver that includes an integrated switch and filter for performing RF and BB peak detection at baseband.

FIG. 4 shows a block diagram of a receiver 401 that includes an integrated switch and filter for performing RF and BB peak detection at baseband. The receiver 401 includes a LNA 405, a mixer 410, integrated filter and switch circuits 415a, 415b, baseband amplifier 430, and peak detector 440. The peak detector 440 is coupled with output terminals of the baseband amplifier 430. While the mixer 410 as shown is a passive mixer, other types of mixer architectures are possible.

Each of the integrated filter and switch circuits 415a-b are coupled across respective portions of the baseband amplifier 430. Integrated filter and switch circuit 415a is disposed between positive input and negative output terminals of the baseband amplifier 430. Integrated filter and switch circuit 415b is disposed between negative input and positive output terminal of the baseband amplifier 430. Each of the integrated filter and switch circuits 415a-b includes a filter component (that includes a capacitor and a resistor) and a switch component that includes a transistor 420a, 420b. In more detail, an integrated filter and switch circuit 415a-b includes a transistor 420a-b coupled with a filter output terminal, a capacitor ("C") coupled with a filter input terminal and the transistor 420a-b (being an example of a switch "S"), and a resistor ("R") coupled with the filter input terminal and the filter output terminal.

In some implementations, the receiver 401, via a controller, is configured to disengage the filtering capability of the circuit 415a-b by causing the transistor 420a-b to be in an off-state, and to engage the filtering capability of the circuit 415a-b by causing the transistor 420a-b to be in an on-state. The gate terminals of the transistors 420a-b are driven by a control signal ("ctrl") to either engage or disengage respective filtering capabilities of the circuits 415a-b. As discussed below with reference to FIG. 5, one portion of the control signal enables the peak detector 440 to measure voltage swings from the LNA 405, while a different, subsequent portion enables the peak detector 440 to measure voltage swings from the baseband amplifier 430.

Figure 5:
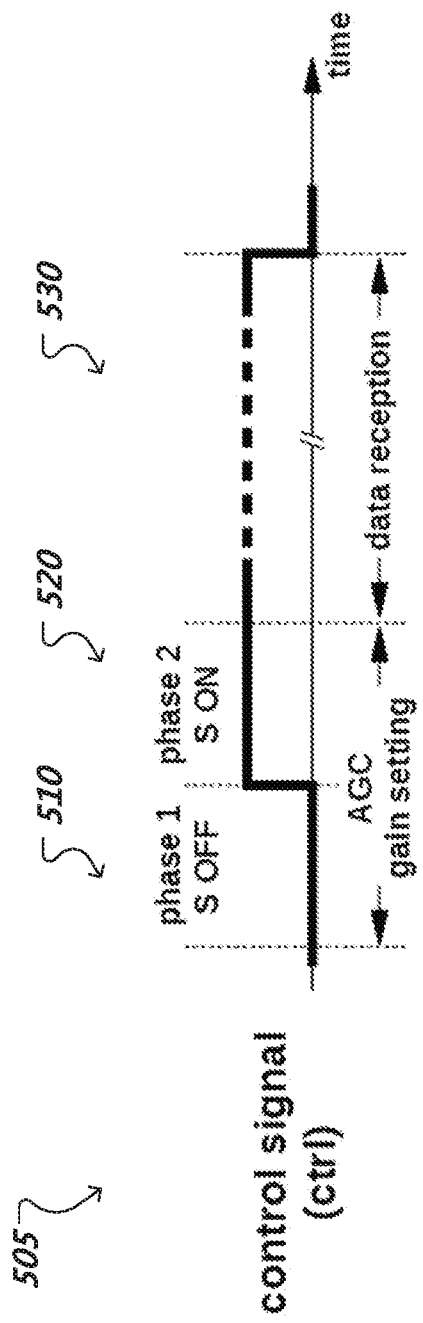
FIG. 5 shows a timing diagram of an example of a control signal to engage and disengage a filter.

FIG. 5 shows a timing diagram of an example of a control signal to engage and disengage a filter. A device controller generates a control ("ctrl") signal 505 to engage or disengage the filters of the integrated filter and switch circuits 415*a-b* of FIG. 4. The control signal 505 includes an RF measurement phase 510, BB measurement phase 520, and a data reception phase 530. During the RF measurement phase 510, the control signal 505 causes the transistors 420*a-b* to be in an off-state (e.g., switch off state labelled "S OFF") which causes the integrated filter and switch circuits 415*a-b* to not filter. During the BB measurement phase 520, the control signal 505 causes the transistors 420*a-b* to be in an on-state (e.g., switch on state labelled "S ON") to allow respective filter capacitors to charge or discharge which causes the integrated filter and switch circuits 415*a-b* to filter. The control signal 505 remains on to cause the transistors 420*a-b* to remain in the on-state during the data reception phase 530. In some implementations, the RF measurement phase 510 and the BB measurement phase 520 correspond at least in part to a preamble portion of a frame, and the data reception phase 530 corresponds at least in part to a data portion of the frame. In some implementations, the preamble portion includes one or more predetermined symbols for AGC.

Note that the preamble duration does not have to be divided into two exact halves for peak detection. A receiver, for example, takes an RF measurement with the switch OFF and reduces the RF amplifier's, e.g., LNA's, gain until the peak detector does not trigger (e.g., signal swing at RF node no longer exceeds a peak detector threshold). Once this is achieved, the receiver moves on to the BBA phase measurement with the switch ON and adjusts the BB amplifier's gain while observing a peak detector threshold.

Figure 6:
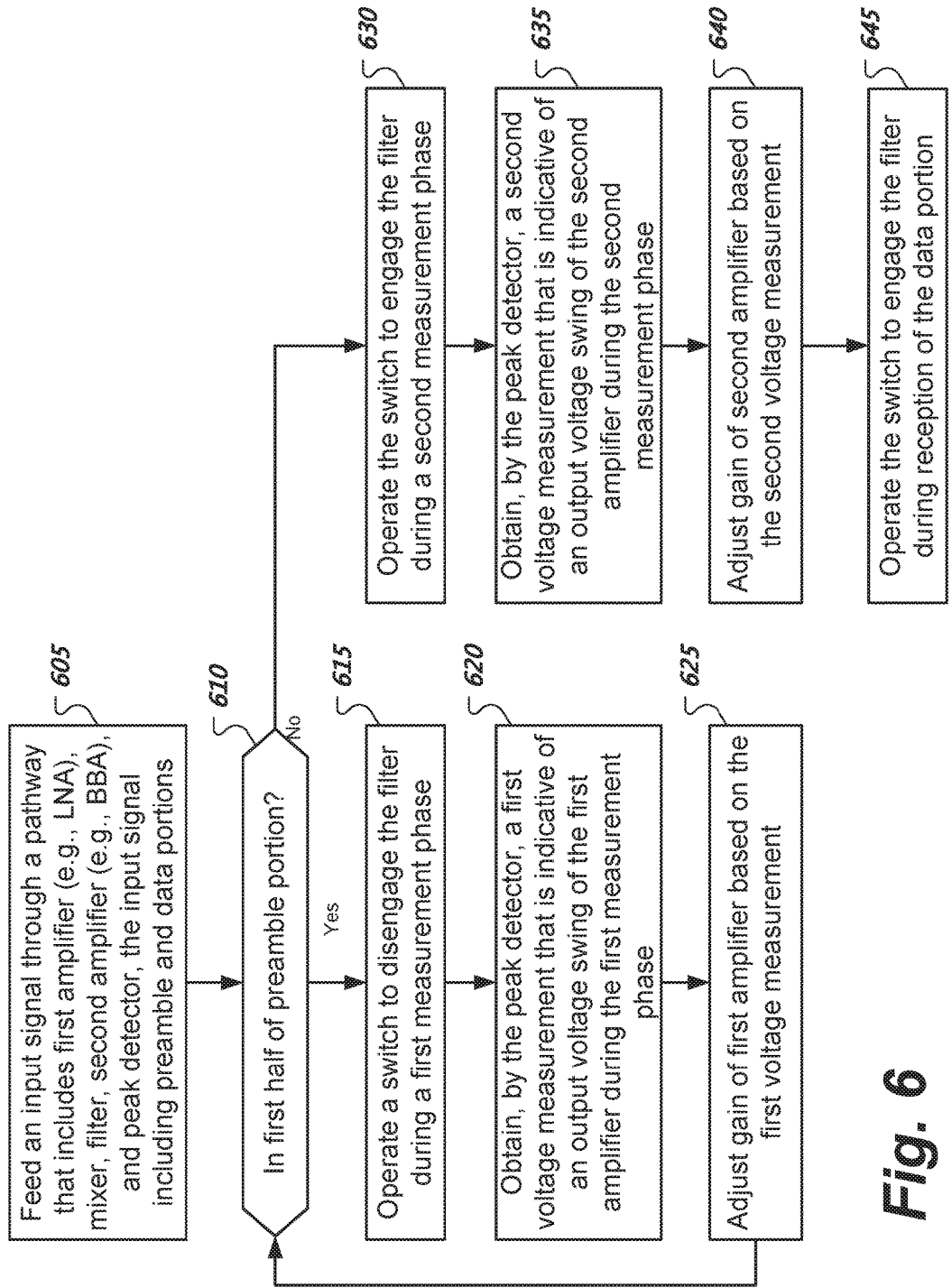
FIG. 6 shows an example of a RF and BB peak detection process.

FIG. 6 shows an example of a RF and BB peak detection process. In some implementations, this process is implemented by a communication device such as the device 205 depicted by FIG. 2 using a combined RF/BB peak detection architecture of FIG. 1 or 4. At 605, the process feeds an input signal through a pathway that includes a first amplifier, a mixer, a filter, a second amplifier, and a peak detector, the input signal including a preamble portion and a data portion. In some implementations, the first amplifier is a LNA and the second amplifier is a BBA.

At 610, the process determines whether the first half of the preamble portion is being received. In some implementations, the determination at 610 includes accessing a timer that starts on an initial detection of a signal. In some implementations, the determination at 610 includes matching a predetermined preamble sequence to a portion of an input signal. If the first half of the preamble portion is being received, then at 615, the process operates a switch to disengage the filter during a first measurement phase. In some implementations, the filter includes a transistor, and the process disengages the filter by causing the transistor to be in an off-state. In some implementations, the process disengages the filter by closing a switch that effectively shorts the filter. At 620, the process obtains, by the peak detector, a first voltage measurement that is indicative of an output voltage swing of the first amplifier during the first measurement phase. At 625, the process adjusts a gain of the first amplifier based on the first voltage measurement. In some implementations, the process decreases the amplifier's gain based on a voltage measurement exceeding a threshold.

In some implementations, the process increases the amplifier's gain based on a voltage measurement not exceeding a threshold.

After processing the first half of the preamble portion, the process moves to handle the second half of the preamble portion. At 630, the process operates the switch to engage the filter during a second measurement phase. In some implementations, the filter includes a transistor, and the process engages the filter by causing the transistor to be in an on-state. In some implementations, the process engages the filter by opening a switch coupled across the filter to prevent the switch from shorting the filter. At 635, the process obtains, by the peak detector, a second voltage measurement that is indicative of an output voltage swing of the second amplifier during the second measurement phase. At 640, the process adjusts a gain of the second amplifier based on the second voltage measurement. In some implementations, the process decreases the amplifier's gain based on a voltage measurement exceeding a threshold. In some implementations, the process increases the amplifier's gain based on a voltage measurement not exceeding a threshold or falling below a minimum threshold.

After processing the preamble portion, the process moves to handle the data portion. At 645, the process operates the switch to engage the filter during reception of the data portion. In some implementations, this process is performed at the start of each packet reception.

In some implementations, the process, at 620, uses a RF/LNA peak detection threshold during the first measurement phase for peak detection associated with the LNA. In some implementations, the process, at 635, uses a BBA peak detection threshold during the second measurement phase for peak detection associated with the BBA. In some implementations, since the peak detector for both the LNA and BBA resides in baseband, the LNA peak detection threshold is established to compensate for a resistance caused by a disengaged filter. For example, while a capacitor of a RC filter is disengaged for RF/LNA peak detection, the resistor of the RC filter remains engaged. In some implementations, for a given node along the receiver chain, the optimum swing, and accordingly the optimum peak detector threshold, are obtained from simulation, where an optimum swing is a trade-off between noise and distortion. In some implementations, the peak detector threshold is programmable to a range of values centered at the optimum value described above, which provides additional flexibility in case of variation on actual silicon.

In some implementations, a switch to selectably engage a filter introduces an additional, parasitic capacitance at the output terminals of the baseband amplifier. In some implementations, this parasitic capacitance is considered when designing an operational amplifier (opamp) of the baseband amplifier, but such capacitance will typically be smaller than the feedback capacitance. Thus, when the switch is ON, the parasitic capacitance can have a minor impact on the RC time-constant of the feedback network of the baseband amplifier. When the switch is OFF, the parasitic capacitance does not limit the bandwidth of the baseband amplifier, so an accurate reading of the voltage swing at the RF node can still be achieved. Since the baseband amplifier operates at low-frequency, the baseband amplifier is not sensitive to parasitic capacitances associated with peak detection, which is a motivation behind performing peak detection at BB instead of RF.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Other embodiments fall within the scope of the following claims.

What is claimed is:

1. A receiver, comprising:
a first amplifier configured to amplify an input signal to generate a first amplified signal;
a mixer, coupled with the first amplifier, the mixer configured to downconvert the first amplified signal to generate a downconverted signal;
a second amplifier, coupled with the mixer, the second amplifier configured to amplify the downconverted signal to generate a second amplified signal;
a filter disposed between the mixer and a peak detector, the filter being selectably engageable by the receiver, the filter configured to remove one or more undesired signal components from the downconverted signal, and the peak detector configured to perform voltage measurements of the second amplified signal; and
switch circuitry configured to:
selectably disengage the filter during a first measurement phase during which a first voltage measurement performed by the peak detector is indicative of an output voltage swing of the first amplifier, wherein the first measurement phase occurs during a reception of a first half of a preamble portion of the input signal; and
selectably engage the filter during a second measurement phase during which a second voltage measurement performed by the peak detector is indicative of an output voltage swing of the second amplifier, wherein the second measurement phase occurs during a reception of a second half of the preamble portion of the input signal.

2. The receiver of claim 1, comprising:
a gain controller, coupled with the first amplifier and the second amplifier, the gain controller configured to receive outputs corresponding to the first and second voltage measurements, and to adjust a gain of the first amplifier based on the first voltage measurement and to adjust a gain of the second amplifier based on the second voltage measurement.

3. The receiver of claim 1, wherein the filter comprises a transistor, wherein the switch circuitry is configured to disengage the filter by causing the transistor to be in an off-state, and wherein the switch circuitry is configured to engage the filter by causing the transistor to be in an on-state.

4. The receiver of claim 1, wherein the filter is coupled between an input terminal of the second amplifier and an output terminal of the second amplifier.

5. The receiver of claim 1, wherein the peak detector is configured to use first thresholds during the first measurement phase and use second thresholds during the second measurement phase, wherein the first thresholds are established for gain control of the first amplifier, and wherein the second thresholds are established for gain control of the second amplifier.

6. The receiver of claim 1, wherein the first and second amplifiers are adjusted before a reception of a data portion of the input signal.

7. The receiver of claim 1, wherein the mixer converts the first amplified signal from a carrier frequency to a baseband frequency, and wherein the mixer comprises an active Gilbert-cell mixer or a passive mixer.

8. A system comprising:
a first amplifier configured to amplify an input signal to generate a first amplified signal;
a mixer, coupled with the first amplifier, the mixer configured to downconvert the first amplified signal to generate a downconverted signal;
a second amplifier, coupled with the mixer, the second amplifier configured to amplify the downconverted signal to generate a second amplified signal;
a filter configured to remove one or more undesired signal components from the downconverted signal;
a peak detector coupled with the second amplifier, the filter being coupled between the mixer and the peak detector, wherein the peak detector performs:
a first voltage measurement of the second amplified signal during a first measurement phase to detect a voltage swing of the first amplifier, wherein the first measurement phase occurs during a reception of a first half of a preamble portion of the input signal; and
a second voltage measurement of the second amplified signal during a second measurement phase to detect a voltage swing of the second amplifier, wherein the second measurement phase occurs during a reception of a second half of the preamble portion of the input signal; and
a controller configured to disengage the filter during the first measurement phase such that an output voltage swing of the first amplifier is preserved for the first voltage measurement by the peak detector, engage the filter during the second measurement phase, adjust a gain of the first amplifier based on the first voltage measurement, and adjust a gain of the second amplifier based on the second voltage measurement.

9. The system of claim 8, wherein the filter comprises a transistor, wherein the controller is configured to disengage the filter by causing the transistor to be in an off-state, and wherein the controller is configured to engage the filter by causing the transistor to be in an on-state.

10. The system of claim 8, wherein the filter is coupled between an input terminal of the second amplifier and an output terminal of the second amplifier.

11. The system of claim 8, wherein the peak detector is configured to use first thresholds during the first measurement phase and use second thresholds during the second measurement phase, wherein the first thresholds are established for gain control of the first amplifier, and wherein the second thresholds are established for gain control of the second amplifier.

12. The system of claim 8, wherein the first and second amplifiers are adjusted before a reception of a data portion of the input signal.

13. The system of claim 8, wherein the mixer converts the first amplified signal from a carrier frequency to a baseband frequency, and wherein the mixer comprises an active Gilbert-cell mixer or a passive mixer.

14. A method comprising:
   amplifying, via a first amplifier, an input signal to generate a first amplified signal;
   performing, by a mixer, a downconversion of the first amplified signal to generate a downconverted signal;
   amplifying, via a second amplifier, the downconverted signal to generate a second amplified signal;
   disengaging a filter during a first measurement phase, the filter being disposed between the mixer and a peak detector, the peak detector being coupled with output terminals of the second amplifier;
   engaging the filter during a second measurement phase; and
   obtaining, by the peak detector:
      a first voltage measurement that is indicative of an output voltage swing of the first amplifier during the first measurement phase, wherein the first measurement phase occurs during a reception of a first half of a preamble portion of the input signal; and
      a second voltage measurement that is indicative of an output voltage swing of the second amplifier during the second measurement phase, wherein the second measurement phase occurs during a reception of a second half of the preamble portion of the input signal.

15. The method of claim 14, comprising:
   adjusting a gain of the first amplifier based on the first voltage measurement; and
   adjusting a gain of the second amplifier based on the second voltage measurement.

16. The method of claim 15, wherein the first and second amplifiers are adjusted before a reception of a data portion of the input signal.

17. The method of claim 14, wherein the filter comprises a transistor, wherein disengaging the filter comprises causing the transistor to be in an off-state, and wherein engaging the filter comprises causing the transistor to be in an on-state.

18. The method of claim 14, wherein the filter is coupled between an input terminal of the second amplifier and at least one of the output terminals of the second amplifier.

19. The method of claim 14, wherein the peak detector is configured to use first thresholds during the first measurement phase and use second thresholds during the second measurement phase, wherein the first thresholds are established for gain control of the first amplifier, and wherein the second thresholds are established for gain control of the second amplifier.

20. The method of claim 14, wherein the input signal comprises a radio frequency signal, and wherein performing the downconversion comprises a conversion from a carrier frequency of the radio frequency signal to a baseband frequency.

21. A receiver, comprising:
   a first amplifier configured to amplify an input signal to generate a first amplified signal;
   a mixer, coupled with the first amplifier, the mixer configured to downconvert the first amplified signal to generate a downconverted signal;
   a second amplifier, coupled with the mixer, the second amplifier configured to amplify the downconverted signal to generate a second amplified signal;
   a filter disposed between the mixer and a peak detector, wherein the filter is coupled between an input terminal of the second amplifier and an output terminal of the second amplifier, the filter being selectably engageable by the receiver, the filter configured to remove one or more undesired signal components from the downconverted signal, and the peak detector configured to perform voltage measurements of the second amplified signal; and
   switch circuitry configured to selectably disengage the filter during a first measurement phase during which a first voltage measurement performed by the peak detector is indicative of an output voltage swing of the first amplifier, and to selectably engage the filter during a second measurement phase during which a second voltage measurement performed by the peak detector is indicative of an output voltage swing of the second amplifier.

\* \* \* \* \*